(12) United States Patent
Jacobs et al.

(10) Patent No.: US 8,947,866 B2
(45) Date of Patent: Feb. 3, 2015

(54) EDGE ARMORED DISPLAY COVER PLATE

(75) Inventors: Joshua Michael Jacobs, Corning, NY (US); Cheng-Chung Li, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 240 days.

(21) Appl. No.: 13/529,141

(22) Filed: Jun. 21, 2012

(65) Prior Publication Data

US 2013/0342971 A1    Dec. 26, 2013

(51) Int. Cl.
*G06F 1/16*    (2006.01)

(52) U.S. Cl.
USPC ............... 361/679.21; 312/221; 455/556.2; 345/168

(58) Field of Classification Search
CPC .................................................. G06F 1/16
USPC ........... 312/7.2, 223.2, 215, 219, 221, 332.1, 312/333; 361/724, 756, 679.44, 679.41, 361/679.31, 679.6, 679.22, 752, 679.4, 361/679.32, 754, 679.33, 679.01, 679.27, 361/679.55, 679.21, 679.23, 679.24; 455/41.1, 558, 411, 550.1, 556.2, 419, 455/405, 301, 3–5, 424, 7, 67.11, 68, 556.1, 455/557, 90.2, 413; 359/599; 345/582, 426, 345/428, 421, 163, 168, 82, 102, 107, 73, 345/157
See application file for complete search history.

(56) References Cited

U.S. PATENT DOCUMENTS

| | | | |
|---|---|---|---|
| 2007/0090734 A1* | 4/2007 | Maruta | 312/223.2 |
| 2009/0017263 A1 | 1/2009 | Yeates | 428/167 |
| 2009/0086123 A1 | 4/2009 | Tsuji et al. | 349/58 |
| 2009/0261694 A1* | 10/2009 | Yamanaka | 312/7.2 |
| 2010/0315570 A1 | 12/2010 | Mathew et al. | 349/58 |
| 2012/0134024 A1* | 5/2012 | Lander et al. | 359/599 |
| 2012/0307457 A1* | 12/2012 | Mukaide | 361/724 |
| 2013/0342971 A1* | 12/2013 | Jacobs et al. | 361/679.01 |

FOREIGN PATENT DOCUMENTS

JP    2010/217340    9/2010

* cited by examiner

*Primary Examiner* — Hung Duong
(74) *Attorney, Agent, or Firm* — Kevin M. Able (57) ABSTRACT

A display device comprising a display panel and a display cover plate positioned between the display panel and an observer. The display cover plate is housed within a protective frame (edge bracket) that protects edges of the display cover plate from damage. The edge bracket supports the edge portions of the display cover plate that are most likely to have flaws resulting from such operations as cutting and grinding, and minimizes flexing of the display cover plate, particularly at an edge, which could result in the formation of cracks at the flaw site and propagation of those cracks.

20 Claims, 5 Drawing Sheets

EDGE ARMORED DISPLAY COVER PLATE

TECHNICAL FIELD

The present disclosure relates to a display device comprising a display cover plate, and in particular a glass display cover plate wherein edge portions of the glass display cover plate are protected by a bracket that minimizes fracture at the edges of the display cover plate.

BACKGROUND

As used herein, the term display device is intended to encompass all electronic devices capable of displaying visual content, including but not limited to computers, including but not limited to laptop, notebook, tablet and desktop computing devices; mobile telephones, cameras (both movie and still) and; televisions (TV). Each of the foregoing devices includes many component parts including the physical case or cabinet in which individual components may reside, circuit boards, power supplies, circuit elements such as integrated electronic components, and of course the display panel itself Currently, these display panels are flat display panels comprising liquid crystal display elements, organic light emitting diode (OLED) display elements, or plasma display elements, and of course the glass or plastic substrates on which many of these elements are disposed and/or enclosed by. In some cases a protective display cover plate may be positioned between an observer and the display panel. The display cover plate not only protects the display panel from mechanical damage, but may in some instances be used to conceal edge bezels used to house the edge portions of the display panel and components associated therewith.

Despite the protective function of the display cover plate, the display cover plate itself may be susceptible to damage, principally because operations performed to shape the display cover plate, such as cutting and/or grinding, may leave flaws at the edges of the display cover plate that may serve as sources for cracks if subject to tensile stress.

SUMMARY

One trend for electronic display devices, and in particular hand-held display devices such as but not limited to tablet computers and cell phones is a thinner, and in some cases overall smaller, form factor, and yet combined with a larger display area. To satisfy the competing requirements for a smaller overall device, yet larger display area (e.g. larger visible display panel), device manufacturers are turning to bezel-less designs. In conventional display devices, certain electronic components are distributed along the edge of the display panel. A bezel formed around a perimeter of an ordinarily rectangular display panel serves to cover the edge positioned electronic components, such as display drive circuitry. Typically, the bezel also covers portions of the display panel, particularly observer-facing edge portions, thereby reducing the display area visible to the observer. Incidentally, the bezel may also protect the edges of the glass components of the display panel, including the protective display cover plate positioned in front of the display panel relative to an observer of the displayed image produced by the display panel. While such display cover plates were often formed of plastic sheet in the early days of hand-held electronic devices, a growing trend has been toward chemically strengthened glass. Such chemically strengthened glass has superior scratch resistance when compared to plastic materials. This scratch resistance offers a particularly advantage for cell phones that are often carried in pockets, along with keys, loose coins and other small hard objects that can contact the display cover plate. Nevertheless, since the glass plates are often cut to size, and the cutting process can lead to flaws at the edge of the glass cover plates, the edges of the glass cover plates can be susceptible to failure arising from fractures originating at these edge flaws. For example, glass fracture occurs when existing flaws experience tensile stress. Such tensile stress can come from flexing of the glass. Accordingly, as the glass cover plate becomes thinner, it can be more susceptible to flexure. At the same time, reducing the size of, or completely eliminating the edge bezel formerly serving to protect and/or support the glass cover plate edges only heightens the danger of failure.

The inventors herein have found that such thin bezel, or bezel-less device designs may benefit when a supporting structure as disclosed herein is positioned behind the glass cover plate, and in particular behind at least the edge portions of the display cover plate relative to an image observer. That is, when a suitable supporting structure is positioned at the back side of the display cover plate. Further benefit can be derived if the supporting structure includes one or more members that provide a cushion or bumper at the perimeter edge surfaces of the display cover plate. While designs using an edge bumper are not precisely bezel-less in the sense that a structure other than the glass cover plate extends beyond the perimeter of the glass cover plate, such bumper structures can be made suitably thin that the edge bumper is visually unobtrusive.

Accordingly, in one example embodiment a display device is disclosed comprising: a cabinet; a display panel; a display cover plate having a first planar major surface, a second planar major surface, and an edge surface connected to the first and second major surfaces; and an edge bracket comprising a first portion positioned adjacent to the first major surface of the display cover plate. The edge bracket may further comprise a second portion forming a closed loop around a perimeter of the display cover plate. A surface of the second portion may be perpendicular to a surface of the first portion. In some examples the display cover plate comprises a chemically strengthened glass, such as an ion-exchanged glass. The display device may comprise an adhesive positioned between the edge bracket and the display cover plate. The adhesive can be, for example, a resilient material such as a silicone material. The display cover plate can be affixed to the display panel with an epoxy having an index of refraction substantially matching an index of refraction of the display panel. In some examples the edge bracket comprises a first portion substantially parallel with the first major surface. In some embodiments the edge bracket comprises a second portion perpendicular to the first major surface. In some examples the edge bracket comprises a second portion connected to the first portion, and the second portion comprises a curved surface. The edge bracket may comprise a hollow channel extending along an interior of the second portion. In some embodiments a resilient material is disposed between the display cover plate and the bracket. For example, a foam material may be positioned between the display cover plate and the bracket.

In another aspect a display device is disclosed comprising: a cabinet; a display panel; a glass display cover plate having a first major surface, a second major surface, and an edge surface substantially perpendicular to the first and second major surfaces; and an edge bracket comprising a first portion positioned adjacent to the first major surface of the display cover plate and a second portion forming a closed loop around a perimeter of the display cover plate, the second portion comprising a curved surface. The second portion may include a hollow interior channel that extends parallel with the edge surface of the display cover plate. The display cover plate can be attached to the display panel with an adhesive. In some examples a resilient material is disposed between the display cover plate and the edge bracket. For example, the resilient material can be an adhesive material such as a silicone material, a foam material, or an adhesive material can be used on conjunction with an adhesive material. In some examples the edge bracket itself may comprises a resilient material.

In still another embodiment a display device is described comprising: a cabinet; a display panel mounted in the cabinet; a display cover plate having a first major surface, a second major surface, and an edge surface substantially perpendicular to the first and second major surfaces, the display cover plate being attached to the display panel with an adhesive; and an edge bracket comprising a first portion positioned adjacent to the first major surface of the display cover plate and a second portion forming a closed loop around a perimeter of the display cover plate. The display panel can comprise, for example, an organic material or a liquid crystal material. The edge bracket can include a hollow channel extending parallel with the edge surface. In some embodiments a resilient material is positioned between the edge bracket and the display plate.

BRIEF DESCRIPTION OF THE DRAWINGS

These and other aspects are better understood when the following detailed description is read with reference to the accompanying drawings, in which.

DETAILED DESCRIPTION

Examples will now be described more fully hereinafter with reference to the accompanying drawings in which example embodiments are shown. Whenever possible, the same reference numerals are used throughout the drawings to refer to the same or like parts. However, aspects may be embodied in many different forms and should not be construed as limited to the embodiments set forth herein.

The aesthetics of display devices, such as televisions, desktop, laptop, notebook and tablet computers, cell phones, are affected by the size and appearance of a bezel that typically exists around a perimeter of such display devices, and in particular around a perimeter of the display panel portion that forms the viewed image. The bezel of a display device is often used to house electronics for driving the pixels of the display panel, as well as, in certain instances, to provide backlighting for the display device if the display panel is edge lighted. For example, an LCD television display panel may include a plurality of backlighting light emitting diodes (LEDs) maintained within the bezel region of the display device.

The trend over the last few years has been toward smaller and smaller bezels. Current bezel widths are in the order of 3 to 10 mm. However, television models having very large display panels have achieved bezel regions having a width as small as 2 mm on at least two borders and 4 mm on the other two borders. Of particular relevance is the continually shrinking size of computing and telecommunication devices, including tablet computers and cell phones. Manufacturers of such hand-held devices are faced with conflicting pressures: to make smaller, thinner devices, while at the same time to maximize the display area. One approach to solving this dilemma is to reduce the size of, or even to eliminate, the bezel surrounding the display panel. In some instances a bezel may be present, but is positioned behind a display cover plate. The manufacturing of smaller bezels has come with certain trade-offs, however. While the display area can be increased, the formerly protective function of the bezel is reduced or entirely removed. Moreover, as the glass of the display panel itself, and/or a display cover plate positioned in front of the display panel becomes thinner, the display panel, and/or the display cover plate becomes more susceptible to flexing, which can lead to failure of the glass should the glass include low strength flaws. As noted above, this can be particular troublesome at the edges of the display and/or cover plate, particularly in the case of glass components.

In some applications, a display cover plate is positioned between the display panel and the observer, wherein the display cover plate is fixed to the display device in some fashion. The display cover plate may serve multiple purposes. For example, in some instances the display cover plate may be purely aesthetic in that it provides an essentially edge-to-edge surface that is sleeker and uninterrupted by discontinuities that might be caused by a bezel. In some instances the display cover plate may be edge lighted so that the cover plate guides light along the edges. In the dark, the display cover plate edges may then glow according to the color of the light. Glowing edges may be activated, for example, when the television is turned off In some instances the display cover plate may be configured to stretch the displayed image through the use of prisms or other optic elements so that the display panel bezel is concealed behind the image. In some instances the display cover plate may be configured to respond to touch in order to activate certain functions of the electronic device. For example, while such touch functionality was previously restricted to computing devices, the line between computing devices and telecommunication devices has blurred, so that many telecommunication devices (e.g. cell phones) include powerful processors, and are structured to run any one or more of thousands of available software applications with the touch of a finger.

However, the display cover plate may also serve a protective function by providing a degree of impact resistance to the display panel positioned behind it. For example, a liquid crystal or organic light emitting diode (OLED) display panel may be less than 1.5 mm in thickness, and is therefore easily susceptible to impact damage. Consequently, a display cover plate may be positioned in front of the display panel, between the display panel and the observer/user of the device. The display cover plate protects the display panel from both impact damage and more cosmetic damage, such as scratching. In some designs the display cover plate may be plastic. However, recent trends have favored a tempered (strengthened) glass such as a chemically (e.g. ion-exchanged) or thermally strengthened glass, as such glass not only serves to protect the device (e.g. display panel) from impact damage, but is quite scratch resistant in and of itself, therefore extending the perceived useful life of the device.

Glass that may be used to form a display cover plate is typically processed to provide a glass having the requisite dimensions for the device. For example, the display cover plate having certain predetermined dimensions may have been cut from a much larger original glass sheet. The display cover plate is typically equal to or less than about 1 mm. Examples of suitable display cover plate thicknesses include equal to or less than about 0.7 mm, equal to or less than about 0.5 mm, or equal to or less than about 0.3 mm. In some embodiments a thickness of the display cover plate may be equal to or less than about 100 µm. The cutting process may leave flaws at the edges of the display cover plate. Grinding or shaping of the edges of the glass display cover plate may eliminate some of these flaws. However, no grinding or polishing operation is capable of eliminating all of the flaws, and in some cases may actually induce additional flaws into the edges of the glass sheet forming the display cover plate. It is well known that glass fractures as a result of tensile stress that may be applied at a flaw site. The tensile stress may cause the flaw to grow and form a crack that can propagate across at least a portion of a glass sheet. Thus, steps should be taken to protect the edges of a glass display cover plate from flexure that could result in a tensile stress being applied to the edges of the plate. Such flexure may result, for example, from impact, or from a more gradual application of force, such as sitting on one's cell phone.

Figure 1:
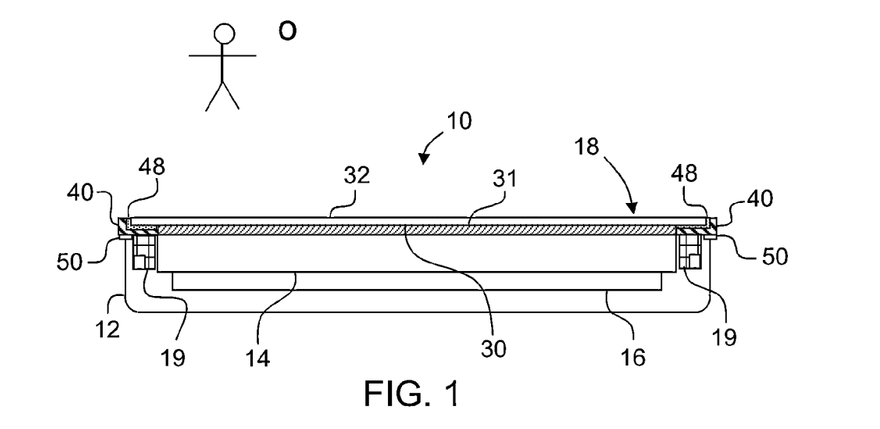
FIG. 1 is a front view of a display device comprising a display panel and a display cover plate supported by an edge bracket.
Figure 2:
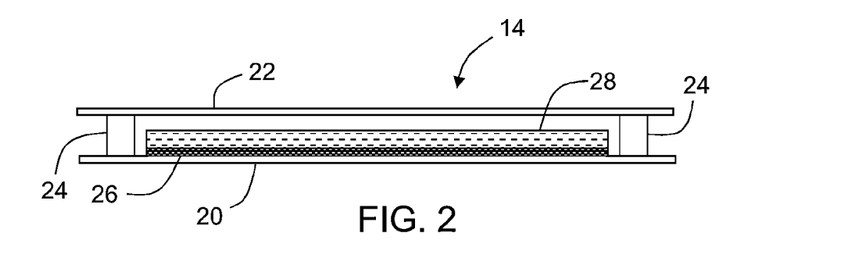
FIG. 2 is a cross sectional view of an exemplary display panel of the display device of FIG. 1.

Referring now to FIG. 1, an exemplary display device 10 is illustrated comprising a display panel. Display device 10 comprises a cabinet 12 that houses the display device components including display panel 14, backlight unit 16 in the case of a liquid crystal display (LCD) device, and display cover plate 18. A bezel 19 may be positioned adjacent at least edge portions of display panel 14. An exemplary display panel 14 is shown in FIG. 2, in this instance a simplified representation of an LCD display panel. Display panel 14 may comprise a first substrate 20, a second substrate 22, a sealing material 24 disposed between the first and second substrates that joins the first substrate to the second substrate, and one or more thin film layers, shown collectively as layer 26, disposed on one or both of the first and second substrates and, again in the case of an LCD device, a layer of liquid crystal material 28. It should be noted that display panel 14 may be any suitable display panel, including without limitation an LCD display panel, an organic light emitting diode display panel comprising an organic light emitting material, a plasma display panel, or the like, that is formed using one or more thin glass substrates.

Figure 3A:
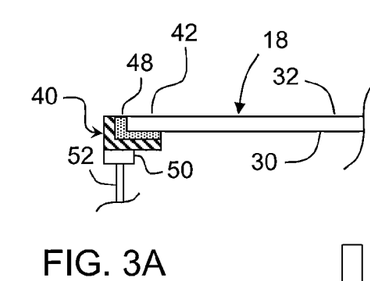
FIG. 3A is a cross sectional view of an edge of the display device of FIG. 1 showing and edge portion of the display cover plate supported by an edge bracket.
Figure 3B:
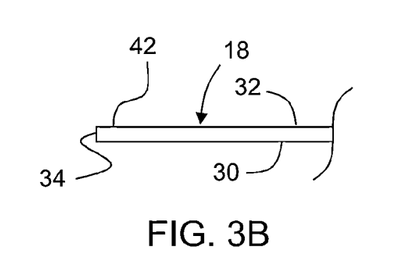
FIGS. 3B and 3C are respectively a side view of an edge portion of a display cover plate and a cross sectional view of an "L" shaped edge bracket that helps support the display cover plate.

As shown in FIGS. 1 and 3A, display cover plate 18 is configured as a planar glass sheet having a first major surface 30 that is planar, a second major surface 32 that is planar and substantially parallel with first major surface 30, and an edge surface 34 (FIG. 3B depicts a portion of display cover plate 18 without edge bracket 40 for clarity) disposed between the first and second major surfaces and forming a perimeter 43 of the display cover plate. Edge surface 34 may be planar, substantially planar, or edge surface 34 may be shaped. For example, display cover plate may undergo grinding and/or polishing such that edge surface 34 may be curved, or at least have a curved portion, or edge surface 34 may have a projecting portion, an angular portion (one or more planar portions, or a combination of any of the foregoing shapes or portions thereof). A curved edge face, wherein the edge face gradually transitions to the major surfaces of the display cover plate avoids the formation of sharp corners than can be easily damaged. Display cover plate 18 is positioned between display panel 14 and the viewer or observer O of the image formed by display panel 14. In some instances display cover plate 18 may be adhered to display panel 14 via an adhesive layer 31 such as a refractive index-matched epoxy. Accordingly, display cover plate 18 may have a refractive index that matches or nearly matches the refractive index of the observer-side portion of display panel 14 (i.e. the surface of display panel 14 facing display cover plate 18) such that the display cover plate appears to be homogeneous with the display panel. Display cover plate 18 may be, for example, a chemically strengthened glass sheet, such as an ion-exchanged glass.

Figure 3C:
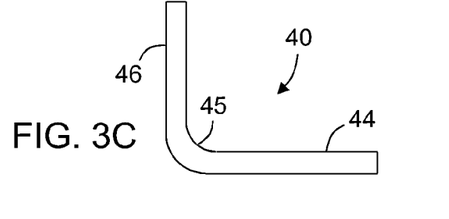
Figure 4:
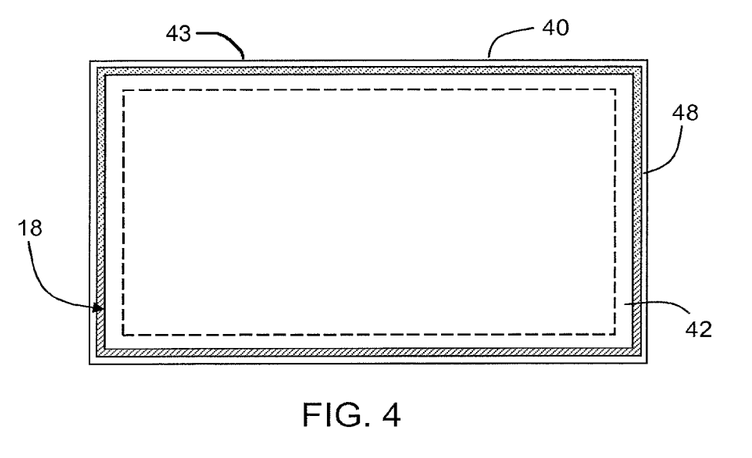
FIG. 4 is a top view of the display device of FIG. 1 showing the edge bracket, an adhesive and a display cover plate.

As best shown in FIG. 3A, display device 10 further includes an edge bracket 40 to support and protect edge portions 42 (see also FIG. 3B) of display cover plate 18. As forming sharp bends in certain materials, such as metal may be difficult, and provide stress areas that can lead to failure of the formed article, edge bracket 40 may comprise a radius portion 45 positioned between a surface of first portion 44 and second portion 46, as best seen with the aid of FIG. 3C. Referring to FIG. 4, edge bracket 40 in some examples forms a closed loop having a rectangular perimeter 43 so that the support bracket is shaped like a picture frame having length and width only slightly larger than the length and width dimensions of display cover plate 18. In such cases, edge bracket 40 defines a hollow interior. As seen in FIGS. 3A, 3B and 3C, a cross section of edge bracket 40 may generally be "L" shaped so that a first portion 44 of edge bracket 40 supports first major surface 30 of the display cover plate at edge portion 42 (i.e. from a side opposite observer O), and a second portion 46 perpendicular to first portion 44 that covers edge surface 34 of display cover plate edge portion 42.

An adhesive layer 48 may be used between the display cover plate and the edge bracket to adhere the display cover plate within the edge bracket. Adhesive layer 48 may be selected so that upon curing, the adhesive retains a degree of resiliency. Adhesive layer 48 may comprise a double-sided adhesive tape. The thickness of the adhesive layer should be small. In some examples, the thickness of the adhesive layer is less than about 10 µm. In some instances a resilient gasket material (not shown) such as natural or synthetic rubber or other resilient polymer, or a foam material may be positioned between the edge bracket and the display cover plate. The resilient material may be used in conjunction with one or more adhesive layers.

Edge bracket 40 may be mounted to cabinet 12 using an optional mounting flange 50 attached to wall 52 of cabinet 12. Mounting flange 50 may be plastic or metal, but should be rigid in order to provide sufficient support for the edge bracket. Edge bracket 40 may be mounted to mounting flange 50 by way of clips, screws or any other suitable mounting method, including welding, soldering, or by way of an adhesive.

In accordance with embodiments of the present disclosure, second portion 46 of edge bracket 40, generally parallel to edge surface 34 and configured to protect edge surface 34 of display cover plate 18, may be relatively thin in a dimension generally parallel with the major surfaces 30, 32 of display cover plate 18, being on the order of equal to or less than 2 mm, such as equal to or less than about 1 mm.

Figure 5:
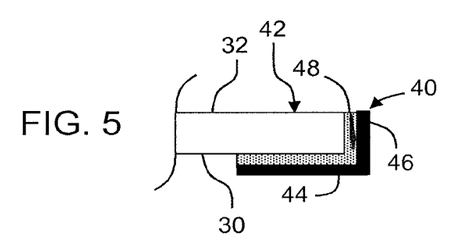
FIG. 5 is a close up cross sectional view of an edge portion of a display cover plate and an edge bracket.
Figure 6:
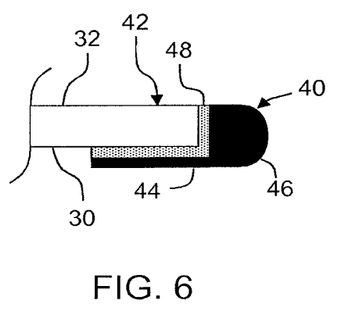
FIG. 6 is a close up view of an edge portion of a display cover plate and another edge bracket.

Shown in FIG. 6 is another embodiment of edge bracket 40 wherein the edge bracket only partially resembles an "L". In the embodiment of FIG. 6, first portion 44 of edge bracket 40 includes a surface that is substantially parallel with first major surface 30, however the edge bracket of FIG. 4 comprises a second portion 46 that includes a curved portion. For example, FIG. 6 illustrates a "D" shaped second portion 46. A curved second portion 46, such as a "D" shaped second portion 46, still provides protection to the edges surfaces 34 of display cover plate 18, but being proportionately larger than the second portion of the "L" shaped edge bracket shown in FIG. 5, a "D" shaped second portion 46 may provide enhanced protection. Indeed, the edge bracket 40 of FIG. 6 may be a composite edge bracket, where a "D" shaped member (e.g. "bumper") is formed on second portion 46 of an "L" shaped edge bracket. In some embodiments, edge bracket 40 may comprise multiple materials, for example having a first portion 44 formed from metal to provide rigidity to the display cover plate supporting portion of the edge bracket, and a second portion 46 comprising a resilient material to mitigate against edge damage to the display cover plate.

Figure 7:
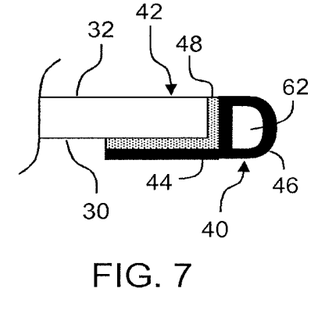
FIG. 7 is a close up view of an edge portion of a display cover plate and still another edge bracket.

In still another embodiment shown in FIG. 7, the "D" shaped portion of the edge bracket shown in FIG. 4 defines a hollow channel 62 that runs along an interior of the edge bracket, generally parallel with edge surface 34, so that a cross section comprises a more distinctive "D" shape. Thus, a hollow second portion 46 may be more resilient than a solid second portion 46, in effect forming a buckle zone where impact with second portion 46 may cause second portion 46 to collapse into the hollow channel and absorb the impact energy.

Figure 8A:
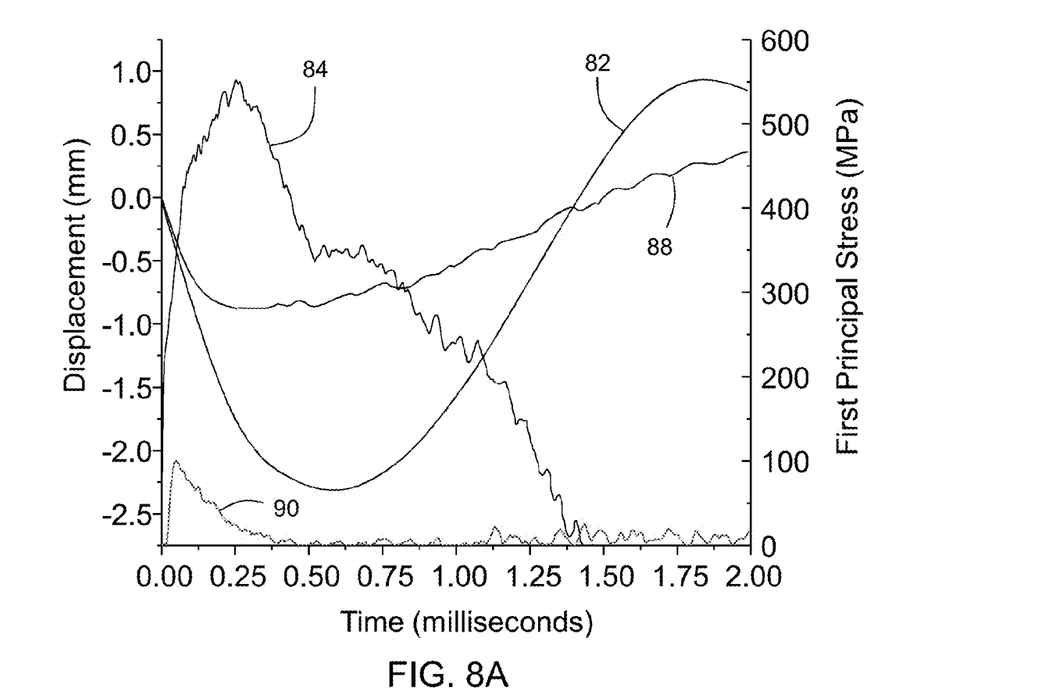
FIG. 8A is a graph of test data resulting from impact testing of glass display cover plates supported by a resilient material, and a resilient material backed by a rigid metal plate.
Figure 8B:
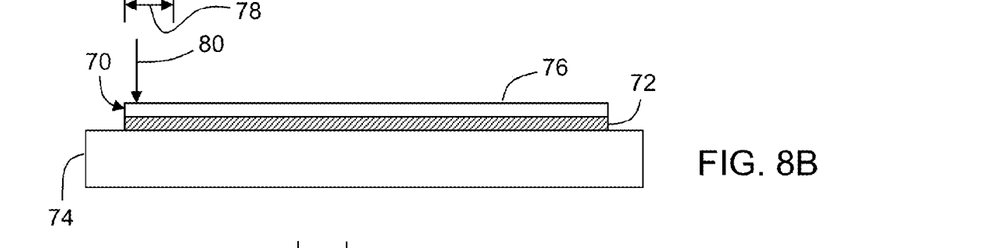
FIG. 8B is a cross sectional illustration of a first configuration of a glass plate and supporting members used during testing to obtain the graph of FIG. 8A.

Referring now to FIG. 8A, a graph is shown depicting the modeled displacement in millimeters of an impacted display cover plate 18 and calculated stress in MPa within the display cover plate, as a function of time in milliseconds, wherein zero time represents the instant of impact. Two configurations were modeled. In the first configuration, shown in FIG. 8B, a chemically strengthened glass sheet 70 having length and width dimensions of 150 mm×150 mm is supported by a rubber pad 72, which in turn is supported on a metal table 74. The glass sheet is impacted at an impact angle perpendicular with the exposed surface 76 of the glass sheet within an edge portion 78 adjacent a perimeter of the glass sheet, as represented by the arrow 80. Curve 82 represents the modeled displacement at the center of the glass sheet, and curve 84 represents the modeled stress.

Figure 8C:
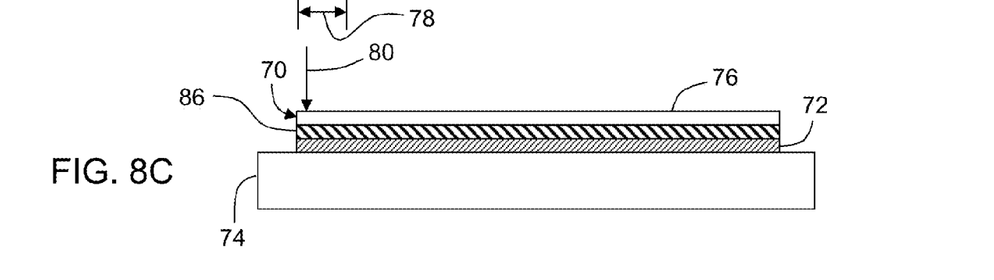
FIG. 8C is a cross sectional illustration of a second configuration of a glass plate and supporting members used during testing to obtain the graph of FIG. 8A.

In the second configuration, shown in FIG. 8C, a metal plate 86 is positioned between chemically-strengthened glass sheet 70 and rubber pad 72, and glass sheet 70 is again impacted in the same manner as in the first configuration. Curve 88 represents the modeled displacement of the glass sheet in the second configuration and curve 90 represents the modeled stress.

The data from FIG. 8A show that in the first configuration, the glass undergoes a large maximum displacement from the rest position of about 2.25 mm (in absolute terms), and a similarly large stress, reaching a peak stress of approximately 550 MPa. In the second configuration, wherein the glass is supported by both a resilient surface and a rigid metal plate, the glass sheet undergoes a peak displacement of only about 0.75 mm, and a similarly small stress, on the order of about 100 MPa. Thus, the data indicate that the additional rigid support positioned behind the glass sheet prevents flexure of the glass sheet that can induce tensile stress into the edges of the glass sheet. Accordingly, a rigid edge bracket, such as an edge bracket formed from metal (e.g. steel), can effectively reduce the displacement of a display cover plate and thereby reduce the tendency of the display cover plate to experience impact damage. Accordingly, another embodiment of the present disclosure is described in reference to FIGS. 9-11.

Figure 9:
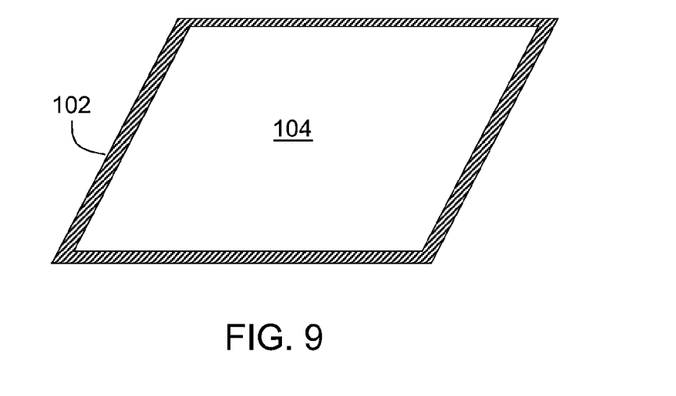
FIG. 9 is a perspective view of another embodiment of an edge bracket illustrating a substantially planar loop defining a central cutout region.
Figure 10:
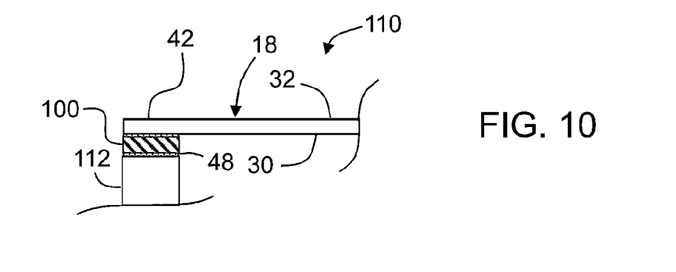
FIG. 10 is a cross sectional edge view of a portion of another embodiment of a device according to the present disclosure utilizing the edge bracket of FIG. 9.
Figure 11:
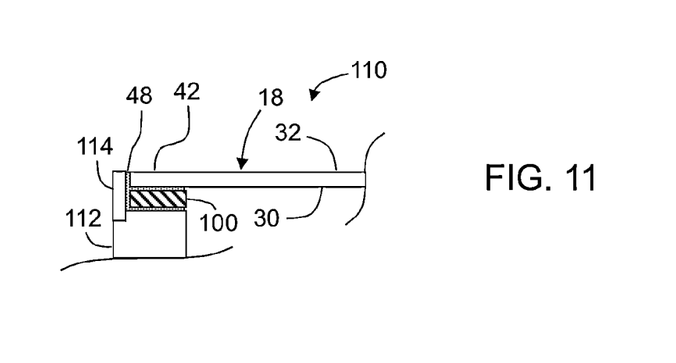
FIG. 11 is a cross sectional edge view of a portion of still another embodiment of a device according to the present disclosure comprising the edge bracket of FIG. 9.
Figure 12:
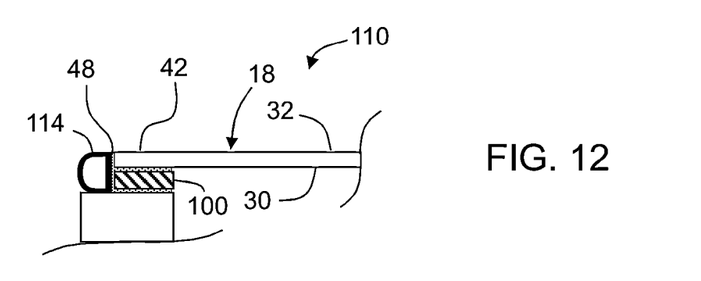
FIG. 12 is a cross sectional edge view of another embodiment of a device according to the present disclosure comprising the edge bracket of FIG. 9, and further including a "D" shaped bumper member positioned adjacent an edge surface of the display cover plate.

FIG. 9 is a perspective view of an edge bracket 100 having as a minimum a first portion 102 in the shape of a closed loop defining a cutout (hollow) region 104. That is, in some embodiments edge bracket 100 is a substantially planar, rectangular frame having a least one smooth major surface for placement adjacent to the display cover plate. Examples of suitable materials for forming edge bracket 100 include metal (e.g. steel, aluminum, titanium or other metals have high rigidity). FIG. 10 is a close-up cross sectional view of a portion of a display device 110 comprising edge bracket 100 disposed between display cover plate 18 and a portion of a cabinet 112. Cabinet may include a mounting flange, a shelf, or any other surface on which edge bracket 100 may be positioned and supported. In accordance with FIG. 11, display device 110 may further comprise a bumper member 114 disposed in a closed loop about a perimeter of the display cover plate. The bumper member protects the edge surface of the display cover plate from impact damage. Consequently, the bumper member may be formed, for example, from a resilient material. For example, the bumper member may be a polymer material applied to the edge surface of the display cover plate, such as with an adhesive. Bumper member 114 may be a "D" shaped body as shown in FIG. 12. As in the preceding embodiments, the bumper member may include an open or closed hollow channel located within the body of the bumper member. In some examples, the bumper member comprises a second portion of edge bracket 100, in that bumper member 114 is an integral part of edge bracket 100, or bumper member may be coupled to edge bracket 100, either directly, or via an adhesive layer 48.

It will be apparent to those skilled in the art that various modifications and variations can be made without departing from the spirit and scope of the claimed invention.

What is claimed is:

1. A display device comprising:
   a cabinet;
   a display panel;
   a display cover plate having a first major surface, a second major surface, and an edge surface defining a perimeter of the display cover plate and connecting to the first and second major surfaces; and
   an edge bracket comprising a first portion and a second portion, wherein the first portion is positioned adjacent to and parallel with the first major surface of the display cover plate and the first portion of the edge bracket is a rigid material, and the second portion is positioned adjacent to and parallel with the edge surface around the perimeter of the display cover plate to form a closed loop around the edge surface.

2. The display device according to claim 1, wherein the first portion of the edge bracket comprises metal.

3. The display device according to claim 1, wherein a surface of the second portion is perpendicular to the first major surface of the display cover plate.

4. The display device according to claim 1, wherein the second portion comprises a curved surface.

5. The display device according to claim 1, wherein the second portion comprises a hollow channel extending along an interior of the second portion.

6. The display device according to claim 1, wherein the display cover plate comprises a chemically strengthened glass.

7. The display device according to claim 1, wherein the display cover plate is affixed to the display panel with an epoxy having an index of refraction substantially matching an index of refraction of the display panel.

8. The display device according to claim 1, wherein a resilient material is disposed between the display cover plate and the edge bracket.

9. A display device comprising:
a cabinet;
a display panel mounted in the cabinet;
a display cover plate formed from glass having a first major surface, a second major surface, and an edge surface substantially perpendicular to the first and second major surfaces; and
an edge bracket comprising a first portion positioned adjacent to and parallel with the first major surface of the display cover plate, the first portion shaped as a closed loop defining a cut-out region, and a second portion forming a closed loop around the edge surface of the display cover plate.

10. The display device according to claim 9, wherein the second portion comprises an outwardly facing curved surface relative to the edge surface of the display cover plate.

11. The display device according to claim 9, wherein the second portion comprises a hollow interior channel.

12. The display device according to claim 9, wherein the display cover plate is coupled to the display panel with an adhesive.

13. The display device according to claim 9, wherein a resilient material is disposed between the display cover plate and the edge bracket.

14. The display device according to claim 9, wherein the edge bracket comprises a resilient material.

15. The display device according to claim 9, wherein the edge bracket is not adjacent to the second major surface of the display cover plate.

16. A display device comprising:
a cabinet;
a display panel;
a display cover plate having a first major surface, a second major surface, and an edge surface substantially perpendicular to the first and second major surfaces, the display cover plate being attached to the display panel with an adhesive; and
an edge bracket comprising a first portion positioned adjacent to and parallel with the first major surface of the display cover plate and a second portion forming a closed loop around the edge surface of the display cover plate, the second portion including an outwardly facing curved surface relative to the edge surface of the display cover plate.

17. The display device according to claim 16, wherein the display panel comprises an organic material or a liquid crystal material.

18. The display device according to claim 16, wherein the second portion of the edge bracket comprises a hollow channel.

19. The display device according to claim 17, wherein the display panel is an LCD or and OLED display panel.

20. A display device comprising:
a cabinet;
a display panel positioned inside the cabinet;
a display cover plate having a first major surface, a second major surface, and an edge surface connecting to the first and second major surfaces, the display cover plate coupled to the display plane and positioned in an exterior direction from the display panel; and
an edge bracket coupled to the display cover plate, the edge bracket comprising a first portion positioned adjacent to and parallel with the first major surface of the display cover plate, wherein the first portion of the edge bracket is a rigid material.

* * * * *

UNITED STATES PATENT AND TRADEMARK OFFICE
CERTIFICATE OF CORRECTION

| | | |
|---|---|---|
| PATENT NO. | : 8,947,866 B2 | Page 1 of 1 |
| APPLICATION NO. | : 13/529141 | |
| DATED | : February 3, 2015 | |
| INVENTOR(S) | : Joshua Michael Jacobs et al. | |

It is certified that error appears in the above-identified patent and that said Letters Patent is hereby corrected as shown below:

In the claims

Claim 20, Column 10, line 39, change "coupled to the display plane..." to --coupled to the display panel...--

Signed and Sealed this
Sixteenth Day of August, 2016

Michelle K. Lee
*Director of the United States Patent and Trademark Office*